(12) United States Patent
Okuyama et al.

(10) Patent No.: US 6,569,367 B1
(45) Date of Patent: *May 27, 2003

(54) METHOD FOR MANUFACTURING ELECTRONIC COMPONENT

(75) Inventors: Shingo Okuyama, Takefu (JP); Tadahiro Nakagawa, Fukui (JP); Takehiko Miura, Takefu (JP); Makoto Fukuda, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/578,370

(22) Filed: May 25, 2000

(65) Prior Publication Data (65)

(30) Foreign Application Priority Data

May 27, 1999 (JP) .......................................... 11-147573

(51) Int. Cl.⁷ .......................... B29C 67/08; B05D 5/12
(52) U.S. Cl. ...................... 264/104; 264/251; 264/254; 427/58; 427/272; 427/282; 427/369
(58) Field of Search ............................... 264/104, 105, 264/250, 254, 267, 273, 251, 129, 259; 427/282, 58, 272, 369

(56) References Cited

U.S. PATENT DOCUMENTS

| 2,543,045 | A | * | 2/1951 | Murray ....................... 101/129 |
| 3,483,287 | A | * | 12/1969 | Davis ....................... 264/297.2 |
| 3,638,567 | A | * | 2/1972 | Walkup et al. ............... 101/170 |
| 4,343,833 | A | * | 8/1982 | Sawae et al. ................. 156/155 |
| 5,185,040 | A | * | 2/1993 | Sakai et al. ................... 118/406 |
| 5,244,143 | A | * | 9/1993 | Ference et al. ......... 228/180.21 |
| 5,531,942 | A | * | 7/1996 | Gilleo et al. ................. 264/104 |
| 5,885,507 | A | * | 3/1999 | Hendrikus ............. 264/272.14 |
| 6,015,520 | A | * | 1/2000 | Appelt et al. ................ 264/104 |
| 6,149,857 | A | * | 11/2000 | McArdle et al. .......... 156/272.4 |
| 6,306,456 | B1 | * | 10/2001 | Fukuda et al. ................. 427/11 |
| 6,335,055 | B1 | * | 1/2002 | Miyahara et al. ............ 101/129 |

* cited by examiner

Primary Examiner—Angela Ortiz
(74) Attorney, Agent, or Firm—Keating & Bennett, LLP

(57) ABSTRACT

The object of the present invention is to reduce irregularity of the amount of applying of the conductive paste applied for forming the side face electrode so as to be extended from a part of the side face of the component body up to a part of the face adjoining the side face, wherein the conductive paste is filled into the slit provided on the slit plate, and the component body is disposed with its side face toward the first principal face side of the slit plate, followed by allowing the shutter member to undergo elastic deformation toward the inside of the slit by compressing the shutter member comprising an elastic material with a projection on the compression member, thereby the conductive paste is applied so as to extend the paste from a part of the side face of the component body up to a part of the faces adjoining the side face while supplying the conductive paste on in the slit so as to swell on the first principal face.

14 Claims, 9 Drawing Sheets

METHOD FOR MANUFACTURING ELECTRONIC COMPONENT

BACKGROUND OF THE INVENTION

1. Field of the Invention

The present invention relates to a method for manufacturing an electronic component and an apparatus for manufacturing the same, particularly to a method for manufacturing an electronic component that requires a paste such as a conductive paste to be coated on a part of the side faces of a component body provided with an electronic component, and to an apparatus for manufacturing the same.

2. Description of the Related Art

FIG. 16 shows a perspective view of the appearance of an electronic component 1 in concern with the present invention. The electronic component having three or more terminals such as, for example, a three-terminal capacitor, a capacitor array, a LC composite EMI filter and a capacitor network assumes an appearance as shown in FIG. 16.

The electronic component 1 comprises, for example, a rectangular column shaped electronic part 2. The terminals provided on this electronic component 1 include end face electrodes 5 and 6 formed on the end faces 3 and 4, respectively, in opposed relation with each other, while side face electrodes 9 and 10 are formed with a predetermined width on the other side faces 7 and 8, respectively, in opposed relation with each other.

Not only the end face electrodes 5 and 6 are formed on the end faces 3 and 4, respectively, but also adjoining face extension parts 13 and 14 are extended onto a part of the side faces 7 and 8 adjoining the end faces 3 and 4, besides extending up to a part of the other pair of the side faces 11 and 12. The side face electrodes 9 and 10 not only extend onto the side faces 7 and 8, respectively, but also have adjoining face extension parts 15 and 16 extending up to a part of the side faces 11 and 12 adjoining the side face electrodes 9 and 10.

These adjoining face extension parts 13 to 16 serve for improving soldering property to the wiring board (not shown) when the electronic part 1 is mounted thereon.

What is concerned with the present invention is a technology particularly for forming the side face electrodes 9 and 10.

An apparatus 17 is shown in FIG. 17 in order to form the side face electrodes 9 and 10. The apparatus 17 is provided with a slit plate 18 made of a metal, and a plurality of slits 19 having a width corresponding to the width of the side face electrodes 9 and 10 are provided on the slit plate 18. The slit plate 18 is placed so as to shut the upper opening of a paste vessel 21 accommodating a conductive paste 20. A cylinder 22 is provided to be connected with the space in the paste vessel 21, and a piston is provided in the cylinder 22.

The component body 2 is firstly disposed so that its one side face 7 contacts the slit plate 18. The conductive paste 20 is fed through the slit 19 by allowing the piston 23 to move along the direction of an arrow 24 so that the paste swells on the upper face of the slit plate 18, while the side face of the component body is in contact with the slit plate, thereby the conductive paste 20 is coated on a part of the side face 7 of the component body 2. The conductive paste is also coated on a part of the side faces 11 and 12 adjoining the side face 7 of the component body 2.

The same procedure is also applied to the other side face 8 of the component body 2.

Subsequently, the conductive paste 20 coated on the component body 2 is baked, and the side face electrodes 9 and 10 comprising the adjoining face extension parts 15 and 16, respectively, as shown in FIG. 16 are formed using the conductive paste 20.

An apparatus 25 is also shown in FIG. 18 in place of the foregoing apparatus 17.

The apparatus 25 has a coating plate 26 comprising an elastic material capable of elastic deformation such as a rubber. A plurality of grooves 27 having a width corresponding to the width of the side face electrode 9 or 10 are provided on the coating plate 26, and the grooves 27 are filled with the conductive paste 28.

The component body 2 is compressed against the coating plate 26 while one side face 7 comes into contact with the coating plate 26, thereby the component body 2 allows the coating plate 26 to deform along the direction of thickness. As a result, the conductive paste 28 in the groove 27 is coated on a part of the side face 7 of the component body 2 with a predetermined width, as well as on a part of the adjoining side faces 11 and 12 by allowing a part of the conductive paste 28 to swell onto the upper face of the coating plate 26.

The same step is also applied on the other side face 8 of the component body 2.

The conductive paste 28 is baked thereafter by the same way as in the case using the apparatus 17 shown in FIG. 17. The side face electrodes 9 and 10 having the adjoining face extension parts 15 and 16 as shown in FIG. 16 are formed using the conductive paste 28.

However, the following problems arise when the apparatus 17 shown in FIG. 17 is used.

As hitherto described, a plurality of slits 19 are provided on the slit plate 18, and the component bodies 2 corresponding to respective slits 19 are disposed. The plural component bodies 2 are held by being arranged on a plane using an appropriate holder (not shown), and are positioned so as to correspond to respective slits 19.

However, it happens that some of the components bodies 2 may be accidentally deficient at specified portions of the holder, when a plurality of the components bodies 2 are held with the holder, whereby no component bodies 2 are present on the specified portions of the slit 19 remaining the portion of the slit to be open. Consequently, since the pressure applied from the piston 23 is readily released through the open portion of the slit 19, the amount of the coated conductive paste 20 on the component body 2, particularly the coating level of the conductive paste 20 to serve as the adjoining face elongation parts 15 and 16, tends to be irregular. This irregularity may well arise not only among the component bodies 2 that are simultaneously treated, but also among the component bodies 2 that are treated in each repeating process.

For solving the problems as described above, it is contemplated to coat the conductive paste 20 on the component body 2 after forming a gap between the component body 2 and the slit plate 18. However, it is difficult to form the side face electrode 9 or 10 with a uniform width, because the width of the side face electrode 9 or 10 becomes wider to an extent not to be negligible than the width of the slit 19, besides making the width of the electrodes wider at the center of the side face. Accordingly, such solving means are inappropriate when the side face electrode 9 or 10 should be formed with finer width, or when a plurality of the side face electrodes having a narrow pitch are desired to be formed on specified side faces (not shown).

For solving the foregoing problems, it can be also contemplated that the slit 19 is so designed as to have a narrower width than the width required for the side face electrode 9 or 10. However, the conductive paste 20 turns out to be left in the slit thus requiring the slit as well as the paste vessel 21 to be frequently cleaned, arising a problem of decreased work efficiency.

The following problems arise, on the other hand, when the apparatus 25 as shown in FIG. 18 is used.

The elastic material such as a rubber constituting the coating plate 26 may be swelled by the effect of organic solvents contained in the conductive paste 28. The organic solvents are pervaded into the elastic material with time lapsing. Such swelling and pervasion not only shortens the service life of the coating plate 26, but also accidentally happens to deform the coating plate 26, thereby the positional accuracy for coating the conductive paste 28 onto the component body 2 is decreased with time.

Frequent cleaning of the coating plate 26 is also required, since the conductive paste is liable to be remained in the groove 27 because the conductive paste 28 filled in the groove 27 of the coating plate 26 is dried up, or the organic solvent contained in the conductive paste infiltrates into the coating plate 26, also arising a problem that the work efficiency is decreased.

SUMMARY OF THE INVENTION

Accordingly, the object of the present invention is to provide a method for manufacturing an electronic component and an apparatus for manufacturing the same that can simultaneously solve the problems that are encountered in the conventional art.

The present invention according to the present invention is directed toward a method for manufacturing an electronic component comprising the steps of preparing a component body, and applying a paste on a part of side faces of the component body with a predetermined width, and comprising the construction as will be described below for solving the technical problems as hitherto described.

The method for manufacturing an electronic component according to the present invention comprises the steps of: preparing a slit plate on which slits having a width corresponding to the width for applying the paste are provided, the slit having a first and second principal face in opposed relation with each other with a predetermined distance apart and the first principal face side serving as a side for disposing the component body; a shutter member comprising an elastic material disposed so as to shut the opening of the slit at the second principal face side of the slit plate; and a compression member for compressing the shutter member so as to allow the shutter member to undergo elastic deformation toward the inside of the slit.

The paste is then filled in the slit, and the component body is disposed so that the side face of the component body is directed toward the first principal face side of the slit plate.

Subsequently, the shutter member is allowed to undergo elastic deformation toward the inside of the slit by compressing the shutter member with the compression member, thereby applying the paste on the part of the side face of the component body while supplying the paste filled in the slit so as to swell onto the first principal face side.

Preferably, the slit plate comprises a plurality of slits. The component body is disposed on the first principal face side by disposing a plurality of the component bodies so as to correspond to each of the plural slits, thereby the paste can be applied on one site on the side face of the component body. Otherwise, the paste can be applied on plural sites on the side face of the component body by disposing one of the component bodies so as to be laid across the plural slits.

The first principal face side of the slit plate is preferably allowed to be in contact with the side face of the component body, when the component body is disposed on the first principal face of the slit plate in the method for manufacturing an electronic component according to the present invention.

The paste in the slit may be applied on the component body so that, not only the paste is applied on a part of the side face of the component body, but also the paste extends from a part of the side face of the component body onto a part of the adjoining face in the method for manufacturing an electronic component according to the present invention.

It is preferable that the step for filling the paste into the slit comprises a step for supplying the paste from the first principal face side of the slit plate into the slit in the method for manufacturing an electronic component according to the present invention.

More preferably, the shutter member is allowed to undergo elastic deformation toward the inside of the slit by compressing the shutter member with the compression member in advance, followed by restoring elastic deformation of the shutter member by releasing the pressure applied to the shutter member from the compression member after applying the paste so as to cover the slit on the first principal face side, thereby to suck the paste into the slit.

More preferably, the step for applying the paste so as to cover the slit on the first principal face side comprises applying the paste so as to extend onto the first principal face, additionally comprising the step of raking the excess paste on the first principal face followed by squeezing the paste into the slit by allowing a squeezer to operate on the first principal face after the step for sucking the paste into the slit.

Preferably, a conductive paste for forming electrodes on a part of the side faces of the component body is used for the paste in the method for manufacturing an electronic component according to the present invention.

The present invention is also directed toward an apparatus for manufacturing an electronic component on which a paste is applied on a part of side faces of a component body with a predetermined width.

The apparatus comprises a slit plate on which slits to be filled with the paste and having a width corresponding to the width for applying the paste are provided, the slit plate having a first and second principal face in opposed relation with each other with a predetermined distance apart, and the first principal face side serving as a side for disposing the component body.

The apparatus also provided with a shutter member comprising an elastic member disposed so as to shut the opening of the slit on the second principal face of the slit plate.

The apparatus further comprises a compression member for compressing the shutter member so as to allow the shutter member to undergo elastic deformation toward the inside of the slit, in order to apply the paste in the slit on a part of the side face of the component body while supplying the paste filled in the slit so as to swell on the first principal face side.

It is preferable that a plurality of the slits are provided on the slit plate in the apparatus for forming an electronic component according to the present invention.

In providing a plurality of the slits, spaces in the slit are preferably defined so that they are not connected with each other among the component bodies to be applied with the paste the plural slits, when the plural slits are provided for applying the paste on the component body.

Preferably, the compression member is provided with projections arranged at the sites in opposed relation to the slits in the apparatus for forming an electronic component according to the present invention. Each projection of the compression member may be provided so as to correspond to each one of the slits, or each projection thereof may be provided so as to correspond to or cover the plural slits, when a plurality of the slits are provided on the slit plate.

Preferably, a cavity being wider than the slit to define a space connected with the space in the slit is provided on at least one of the second principal face side of the slit plate and the slit plate side of the shutter member in the apparatus for manufacturing an electronic component according to the present invention.

When the cavities are provided as described above besides providing a plurality of the slits on the slit plate, each cavity may be provided so as to correspond to each one of slits, or each cavity may be provided so as to correspond to or cover the plural slits.

DESCRIPTION OF THE PREFERRED EMBODIMENT

Figure 1:
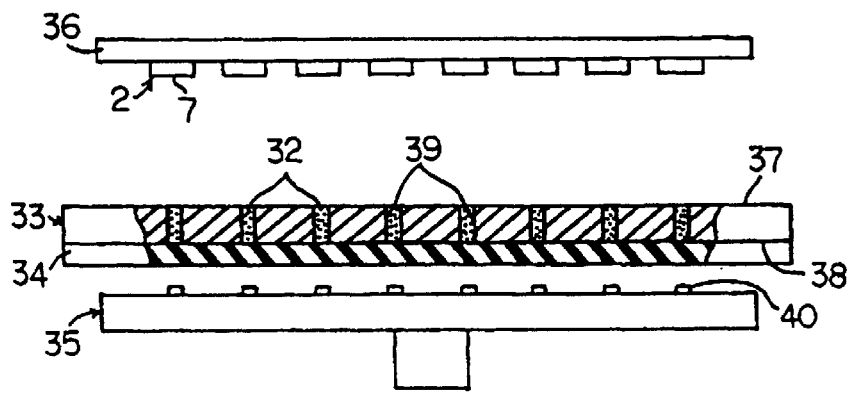
FIG. 1 is provided for illustrating the first embodiment of the present invention, showing a front view of a partial cross section of the basic structure provided in an apparatus 31 for manufacturing an electronic component.
Figure 2:
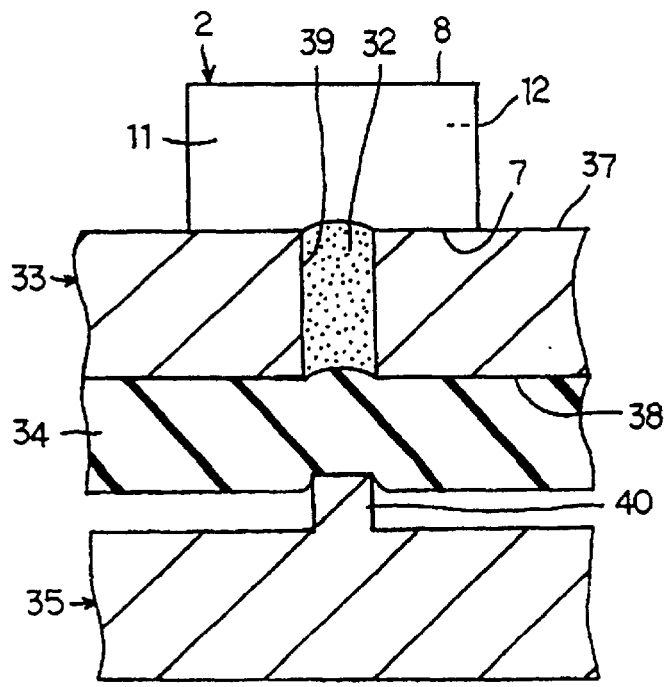
FIG. 2 is an enlarged cross section of a main part of the apparatus 31 for manufacturing an electronic component shown in FIG. 1.
Figure 16:
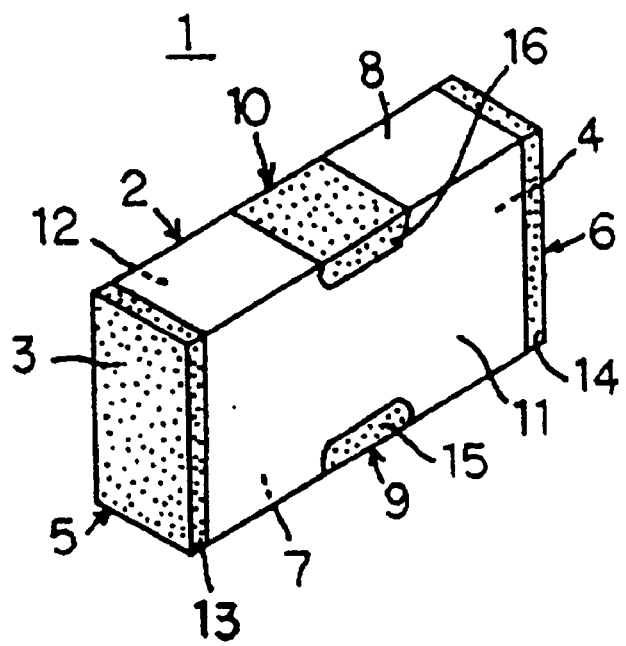
FIG. 16 is a perspective view showing an appearance of the electronic component 1 in concern with the present invention.
Figure 17:
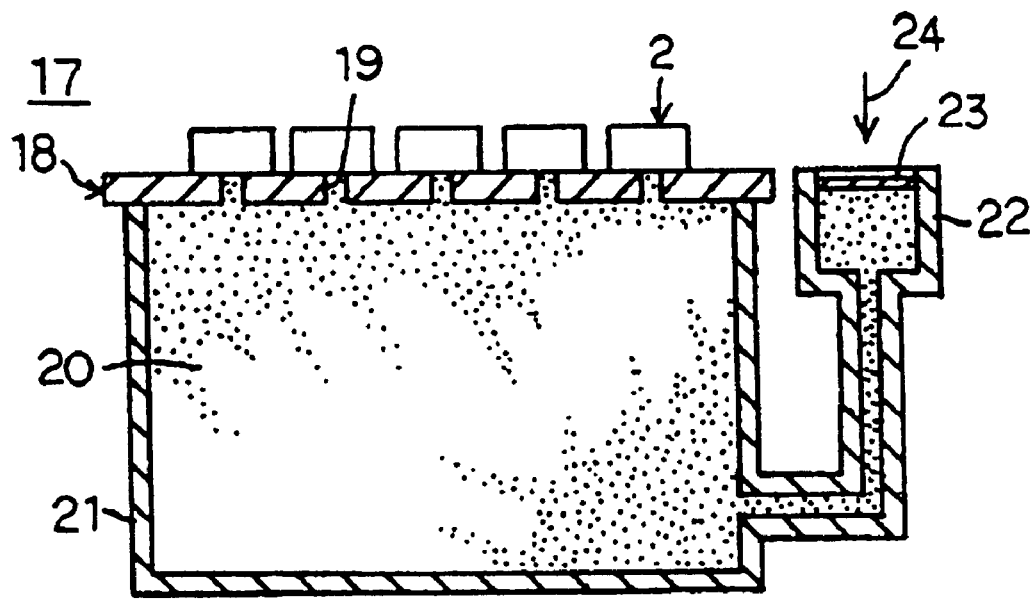
FIG. 17 is a cross section of the conventional apparatus 17 to be used for forming the side face electrode 9 or 10 of the electronic component 1 shown in FIG. 16.
Figure 18:
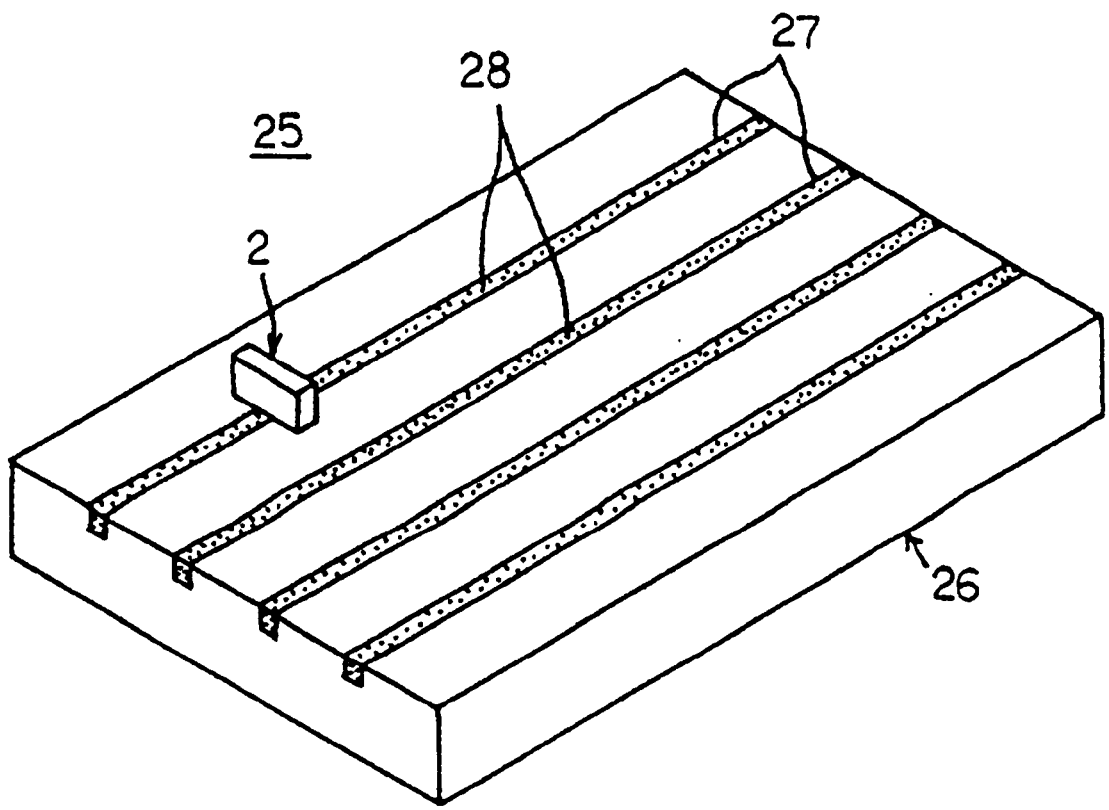
FIG. 18 is a perspective view of the conventional apparatus 25 to be used for forming the side face electrode 9 or 10 of the electronic component 1 shown in FIG. 16.

FIGS. 1 to 3 is provided for illustrating the first embodiment of the present invention. While a basic structure provided in an apparatus 31 for manufacturing an electronic component is illustrated in FIG. 1, the apparatus 31 is used for applying a conductive paste 32 on a component body 2 as shown in FIG. 16, in order to form a side face electrode 9 or 10 having an adjacent face extension part 15 or 16 so that the electrode is extended onto a part of a side face 7 or 8 of the component body 2 for use in an electronic component 1, and from the part of the side face 7 or 8 onto a part of side faces 11 and 12 adjoining the side face 7 or 8.

The manufacturing apparatus 31 comprises a slit plate 33, a shutter member 34 and a compression member 35. A plurality of the component bodies 2 are held on a holder 36.

The slit plate 33 comprises first and second principal faces 37 and 38 in opposed relation with each other with a predetermined distance apart. As shown in FIG. 2, the first principal face 37 side defines a side for disposing the component bodies 2. The slit plate 33 is provided with a plurality of slits 39 for filling a conductive paste 32 and having a width corresponding to the width for applying the conductive paste 32 onto the component bodies 2. Such slit plate 33 is made of a rigid material such as an iron-based metal including stainless steel or a ceramic.

The shutter member 34 is disposed so as to shut openings of the slits 39 at the second principal face side 38 of the slit plate 33. The shutter member 34 is made of an elastic material such as a silicone rubber with a thickness of 5 mm or less, preferably about 1 mm. It is preferable that the shutter member 34 is formed by being bonded and integrated with the slit plate 33 in close contact with the slit plate 33. The shutter member 34 may be formed of a resin film other than the silicone rubber, or any materials and configurations may be allowed provided that the shutter member is allowed to undergo elastic deformation by a pressure applied from below, and elastic deformation is restored by releasing the pressure.

The compression member 35 serves for compressing the shutter member 34 to allow the shutter member 34 to undergo elastic deformation toward the inside of the slit 39, in order to apply the conductive paste 32 in the slit 39 on the component body 2 while supplying the conductive paste 32 in the slit 39 so that it swells on the first principal face 37 side of the slit plate 33. The compression member 35 is provided so that it comes close to the slit plate 33 and shutter member 34 from under the shutter member 34 using a driving device (not shown). The compression member 35 is made of a rigid material such as a metal or a ceramic.

Projections 40 are provided at the sites on the face of the compression member 35 in opposed relation to the slit 39 of the slit plate 33. A plurality of the projections 40 are provided corresponding to each of the slits 39, and the projection 40 has a width equal to or narrower than the width of each slit 39.

With reference to FIGS. 1 and 2, the method for manufacturing the electronic component, particularly the method for applying the conductive paste 32 for the side face electrode 9, will be described hereinafter.

A manufacturing apparatus 31 provided with the slit plate 33, shutter member 34 and compression member 35 as shown in FIG. 1 is at first prepared.

Then, the conductive paste 32 is filled in each slit 39 of the slit plate 33. while the conductive paste 32 is preferably supplied into each slit 39 from above the slit plate 33 for filling the conductive paste 32 into the slit 39, details of the process will be described hereinafter with reference to FIG. 3.

Subsequently, a plurality of the component bodies held with a holder 36 are disposed at the first principal face 37 side of the slit plate 33. One side face 7 of the component body 2 is directed toward the first principal face 37 side so that the side face 7 preferably comes into contact with the first principal face 37. Each slit 39 usually has a relatively rectangular plane shape, and plural component bodies 2 are disposed with a predetermined distance apart with each other along a longitudinal direction of the slits 39. These component bodies 2 are simultaneously subjected to the following process.

The shutter member 34 is then compressed with the compression member 35 as shown in FIG. 2, thereby the compression member 35, especially its projections 40, allows the shutter member 34 to undergo elastic deformation toward the inside of the slit 39. Consequently, the conductive paste 32 filled in the slit 39 is swelled and supplied on the first principal face 37 side of the slit plate 33, whereby the conductive paste 32 in the slit 39 is applied on a part of the side face 7 of the component body 2. The conductive paste 32 is not only applied on the side face 7, but also extended from the side face 7 up to a part of the adjoining side faces 11 and 12.

After applying the conductive paste 32 on one side face 7 of the component body 2, the other face 8 of the component body 2 is also subjected to the same process as described above.

The conductive paste 32 applied on the component body 2 is baked thereafter, and the side face electrodes 9 and 10 are formed as shown in FIG. 16.

While the conductive paste 32 is supplied from the first principal face 37 side of the slit plate 33 into the slit 39 when the slit 39 is filled with the conductive paste 32, the conductive paste 32 is preferably filled into the slit 39 by the method as described below.

Figure 3A:
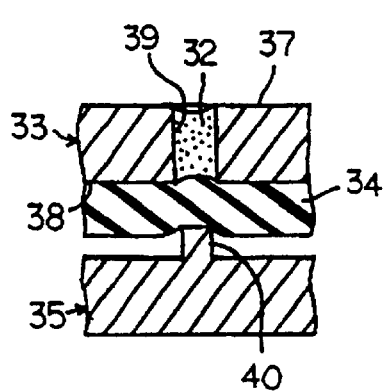
FIG. 3A is a cross section showing the first step for filling the conductive paste 32 into the slit 39 on the slit plate 33 provided in the manufacturing apparatus 31 shown in FIG. 1.

With reference to FIGS. 3A to 3D, the shutter member 34 is previously allowed to undergo elastic deformation toward the inside of the slit 39 by compressing the shutter member 34 with the compression member 35 as shown in FIG. 3A. This compressed state corresponds to the state when the component member 2 is removed from the slit plate 33, while the position of the compression member 35 is remained unchanged after completing applying of the conductive paste 32 onto the component body 2.

Figure 3B:
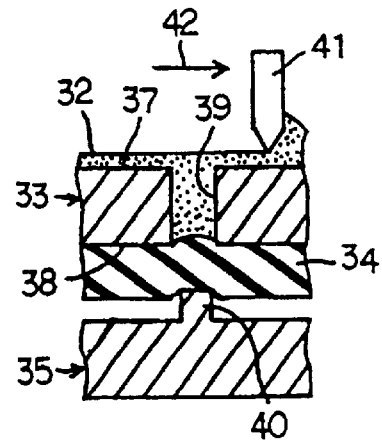
FIG. 3B is a cross section showing the second step for filling the conductive paste 32 into the slit 39 on the slit plate 33 provided in the manufacturing apparatus 31 shown in FIG. 1.

The conductive paste 32 is then applied in the next step as shown in FIG. 3B so that the conductive paste covers the slit 39 on the first principal face 37 side of the slit plate 33. For example, a squeezer 41 is used for applying the conductive paste 32, and the conductive paste 32 is applied on the first principal face 37 so as to be spread with a predetermined thickness by allowing the squeezer to travel along the direction of an arrow 42.

Figure 3C:
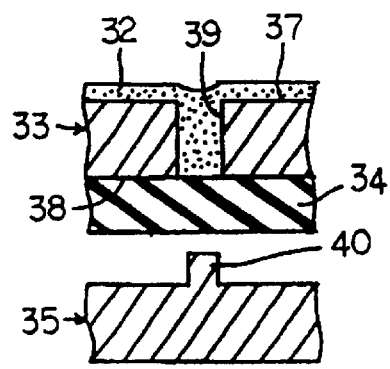
FIG. 3C is a cross section showing the third step for filling the conductive paste 32 into the slit 39 on the slit plate 33 provided in the manufacturing apparatus 31 shown in FIG. 1.

Subsequently, as shown in FIG. 3C the pressure applied on the shutter member 34 from the compression member 35 is released, thereby elastic deformation of the shutter member 34 is restored. The conductive paste 32 is sucked into the slit 39 in response to restoration of the plastic deformation.

Figure 3D:
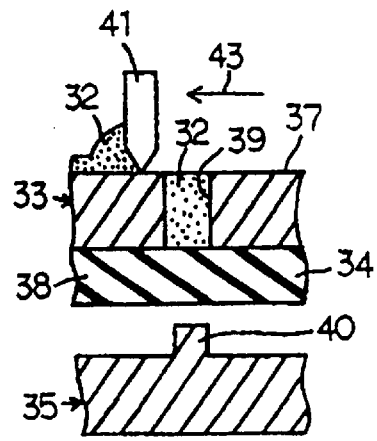
FIG. 3D is a cross section showing the fourth step for filling the conductive paste 32 into the slit 39 on the slit plate 33 provided in the manufacturing apparatus 31 shown in FIG. 1.

Then, as shown in FIG. 3D the excess conductive paste is scraped off by allowing the squeezer 41 to travel, for example, along the direction of an arrow 43 on the first principal face 37. The squeezer 41 also serves for squeezing the conductive paste 32 into the slit 39.

While the conductive paste 32 is filled or replenished into the slit 39 by the method as described above, the filling or replenishing step and the applying step are repeated alternately when the conductive paste 32 is repeatedly applied to the component body 2 as hitherto described.

FIGS. 4 to 15 are provided for describing various embodiments of the present invention. In FIGS. 4 to 15, the same reference numerals are given to the elements that have been shown in FIGS. 1 to 3, and similar explanations are not repeated.

Figure 4:
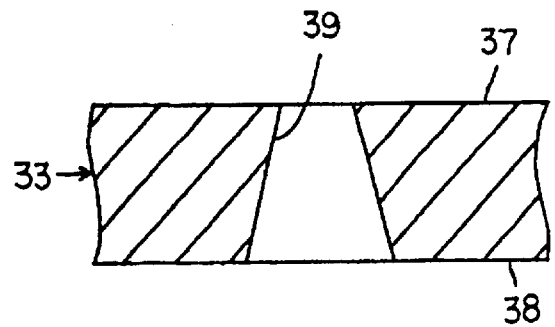
FIG. 4 is provided for illustrating the second embodiment of the present invention, showing a cross section of a portion where a slit 39 of the slit plate 33 is provided.

FIG. 4 is provided for illustrating the second embodiment of the present invention, showing the portion where the slit 39 is provided in the slit plate 33. As shown in FIG. 4, the slit 39 may be provided with a taper being expanded at the second principal face 38 side of the slit plate 33.

Figure 5:
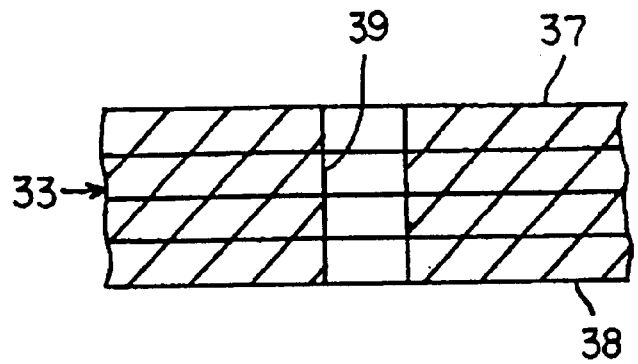
FIG. 5 is provided for illustrating the third embodiment of the present invention, showing a cross section of a portion where a slit 39 of the slit plate 33 is provided.

FIG. 5 is provided for illustrating the third embodiment of the present invention, showing the slit 39 is provided in the slit plate 33. As shown in FIG. 5, the slit plate 33 may be constructed by laminating a plurality of plates.

Figure 6:
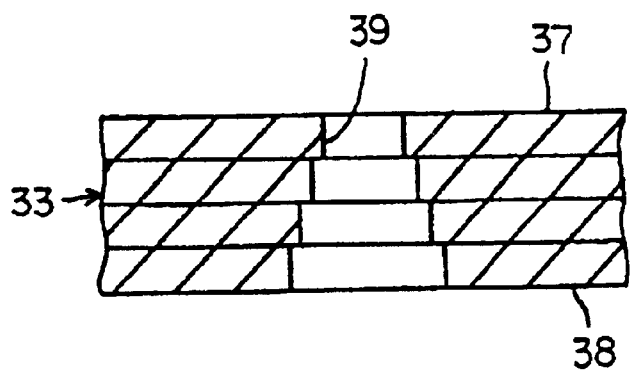
FIG. 6 is provided for illustrating the fourth embodiment of the present invention, showing a cross section of a portion where a slit 39 of the slit plate 33 is provided.

FIG. 6 is provided for illustrating the third embodiment of the present invention, showing the slit 39 is provided in the slit plate 33. As shown in FIG. 6, the slit plate 33 is constructed by stacking a plurality of plates, wherein the slit 39 may substantially define a tapered configuration by allowing the width of the slit in each of these plural plates to change in the order of stacking.

Figure 7:
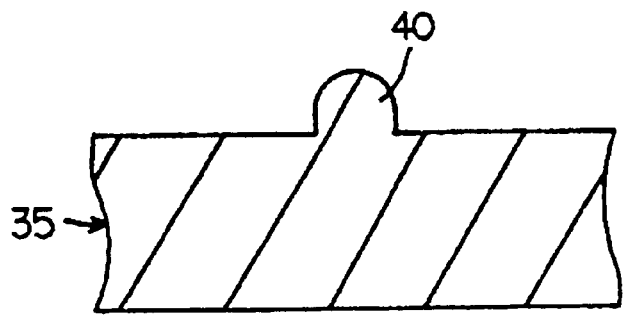
FIG. 7 is provided for illustrating the fifth embodiment of the present invention, showing a cross section of a portion where a projection 40 of the compressing member 35 is provided.

FIG. 7 is provided for illustrating the fifth embodiment of the present invention, showing the portion where a projection 40 is provided on the compression member 35. As shown in FIG. 7, the cross section of the projection 40 is not a square as shown in FIG. 2, but it may be formed to have a round shape.

Figure 8:
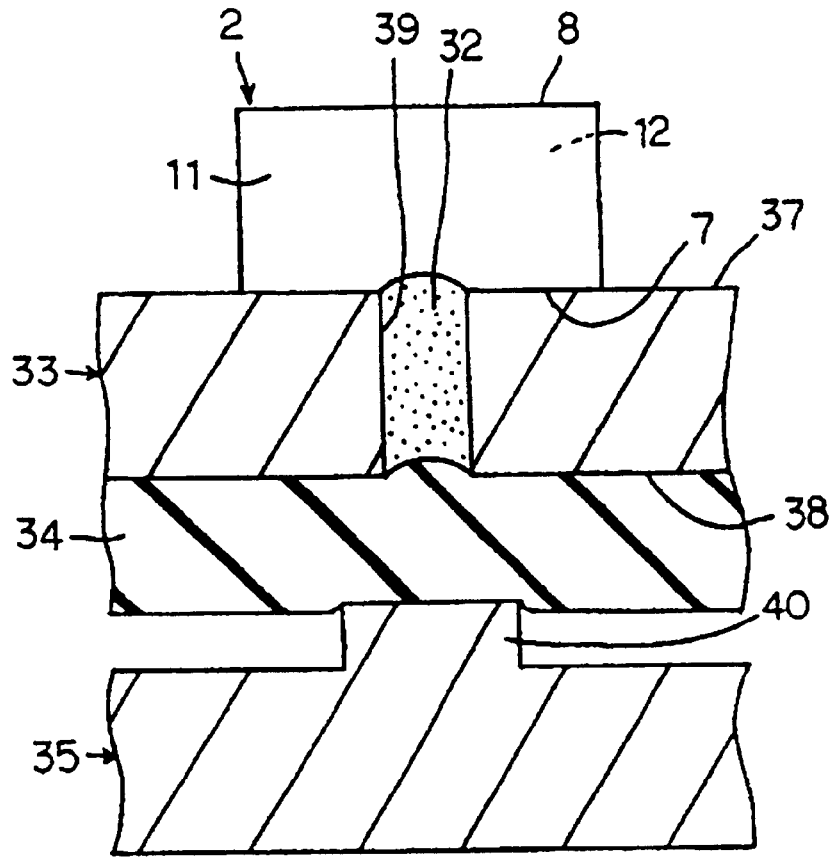
FIG. 8 is provided for illustrating the sixth embodiment of the present invention corresponding to FIG. 2.

FIG. 8 is provided for illustrating the sixth embodiment of the present invention corresponding to FIG. 2. As shown in FIG. 8, the projection 40 formed on the compression member 35 may have a width wider than the slit 39.

Figure 9:
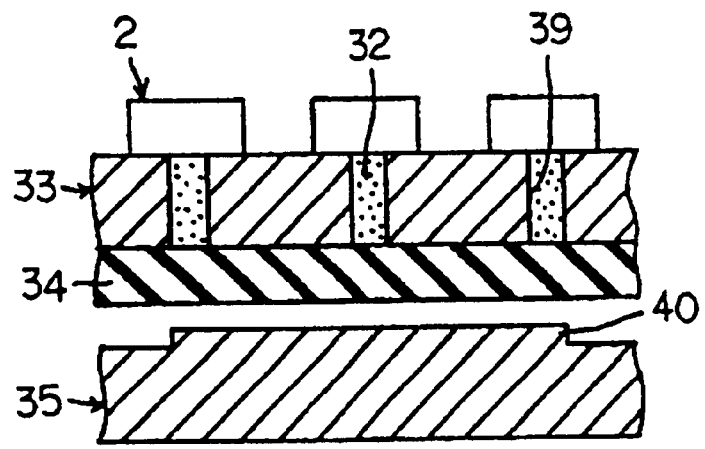
FIG. 9 is provided for illustrating the seventh embodiment of the present invention, being a cross section showing the relation between the slit 39 of the slit plate 33 and the compression member 35.

FIG. 9 is provided for illustrating the seventh embodiment of the present invention showing a part of FIG. 1, although the figure is enlarged as compared with FIG. 1. While the projection 40 is provided so as to correspond to each slit 39 in FIG. 2 or 8, the projection 40 may be provided so as to correspond to or cover plural slits 39 as shown in FIG. 9.

Figure 10:
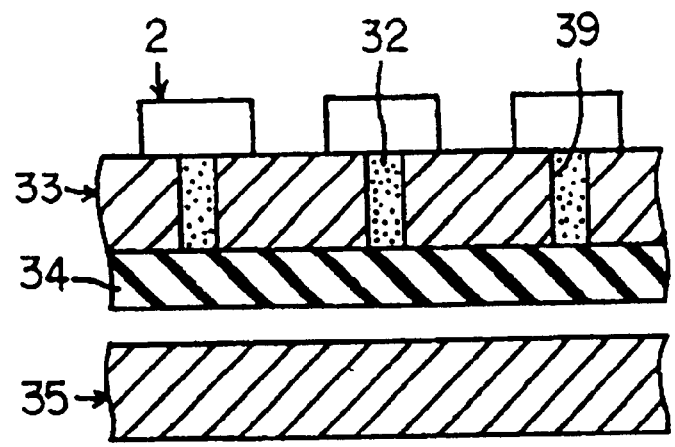
FIG. 10 is provided for illustrating the eighth embodiment of the present invention corresponding to FIG. 9.

FIG. 10 is provided for illustrating the eighth embodiment of the present invention that corresponds to FIG. 9. As shown in FIG. 10, no projections are provided on the compression member 35, but the shutter member may be compressed with the entire face of the compression member 35.

Figure 11:
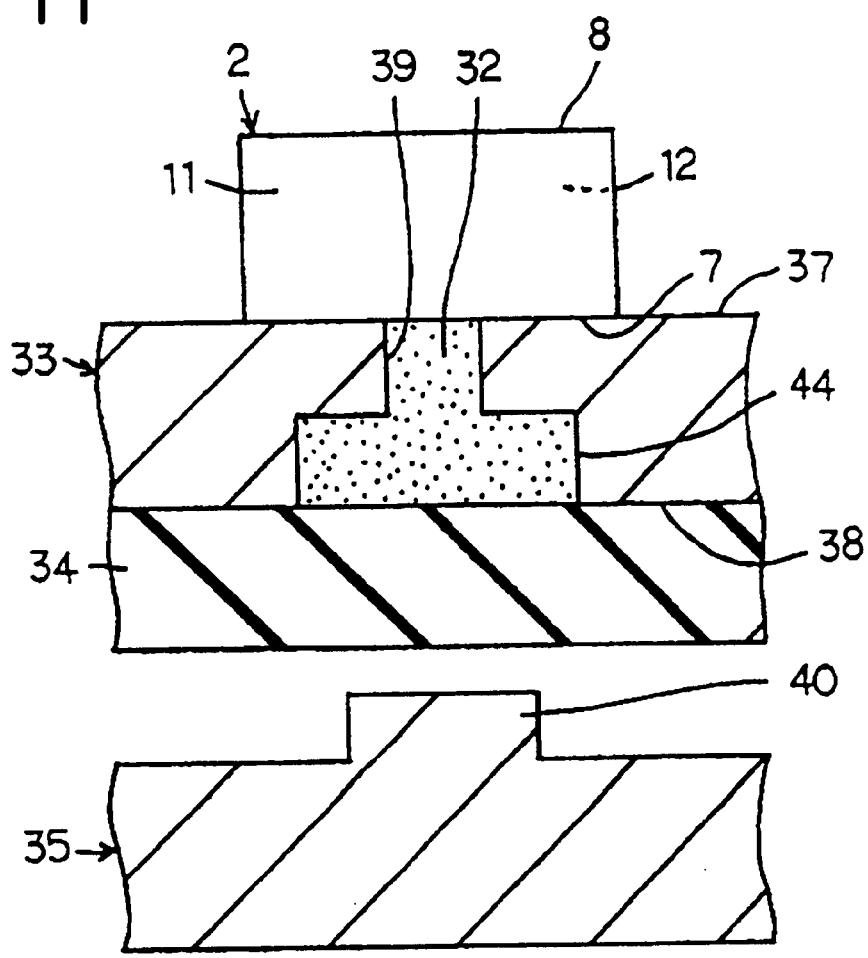
FIG. 11 is provided for illustrating the ninth embodiment of the present invention, showing a cross section in which a cavity 44 is provided in relation to the slit 39 of the slit plate 33.

FIG. 11 is provided for illustrating the ninth embodiment of the present invention, showing the portion corresponding to the portion shown in FIG. 2. As shown in FIG. 11, a cavity 44 may be provided at the second principal face side 38 of the slit plate 33, and the cavity 44 defines the space connected with the space in the slit 39 and is wider than the slit 39.

Figure 12:
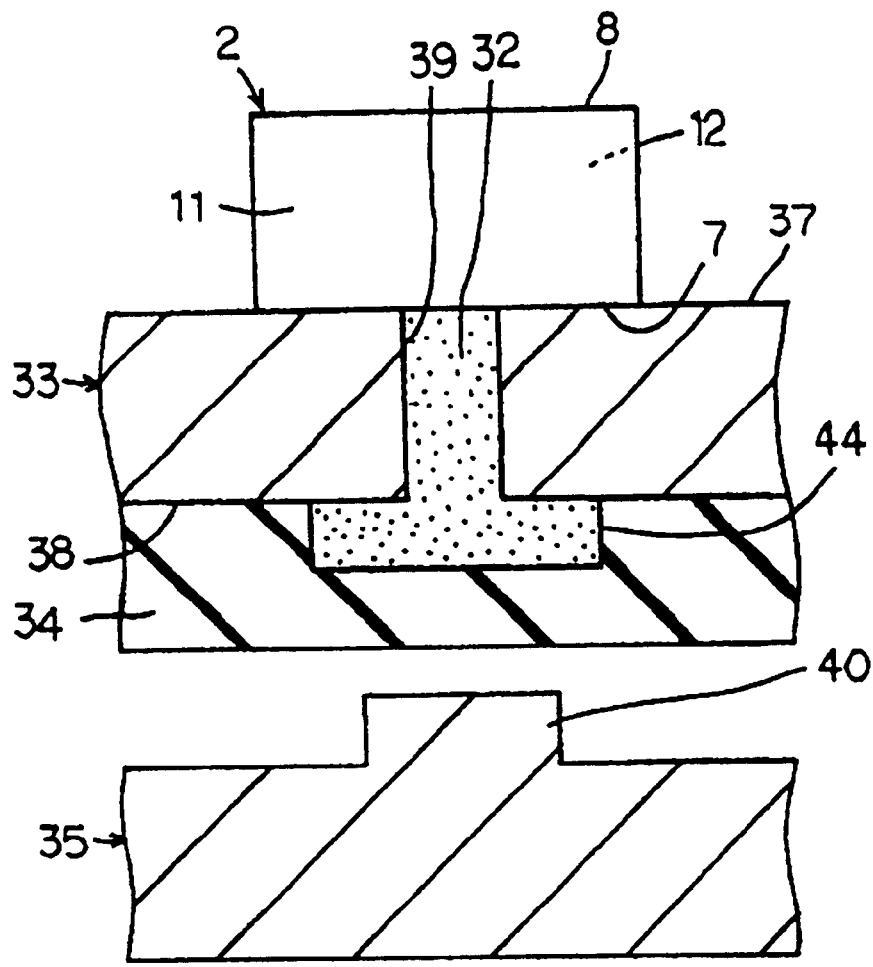
FIG. 12 is provided for illustrating the tenth embodiment of the present invention corresponding to FIG. 11.

FIG. 12 is provided for illustrating the tenth embodiment of the present invention that corresponds to FIG. 11. As shown in FIG. 12, the cavity 44 may be provided in the shutter member 34 on a side toward the slit plate 33.

Although the projection 40 provided on the compression member 35 preferably has a width narrower than the width of the cavity 44 in the embodiment shown in FIGS. 11 and 12, the cavity may have a width exceeding the width of the cavity, otherwise the projection may be provided so as to be arranged across the plural slits.

The cavity 44 may be provided both on the slit plate 33 and the shutter member 34, although its illustration is omitted.

Figure 13:
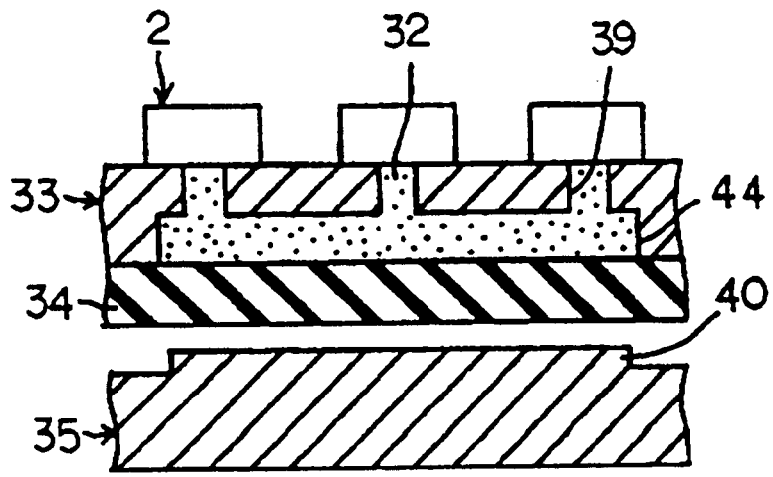
FIG. 13 is provided for illustrating the eleventh embodiment of the present invention, being a cross section showing the relation between the cavity 44 and the slit 39.

FIG. 13 is provided for illustrating the eleventh embodiment of the present invention corresponding to FIG. 11, wherein a wider area is shown by scaling FIG. 11 down. While each cavity 44 is provided so as to correspond to each of the slits 39 in FIGS. 11 and 12, the cavity 44 may be provided so as to correspond to or cover plural slits 39. The width of the projection 40 provided on the compression member 35 may be widened in accordance with the width of the cavity 44.

Figure 14:
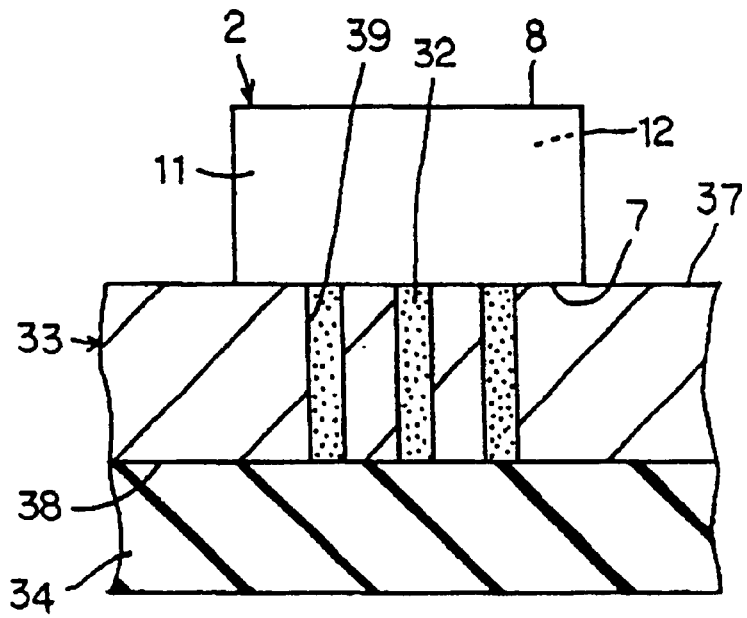
FIG. 14 is provided for illustrating the twelfth embodiment of the present invention, being a cross section showing the relation between the slit 39 and the component body 2.

FIG. 14 is provided for illustrating the twelfth embodiment of the present invention, showing the shutter member 34 and the component body 2. This embodiment is applied when side electrodes are formed with respective predetermined widths at a plural sites on the side face 7 of the component body 2, wherein one component body 2 is disposed so as to lay over plural slits 39.

Figure 15:
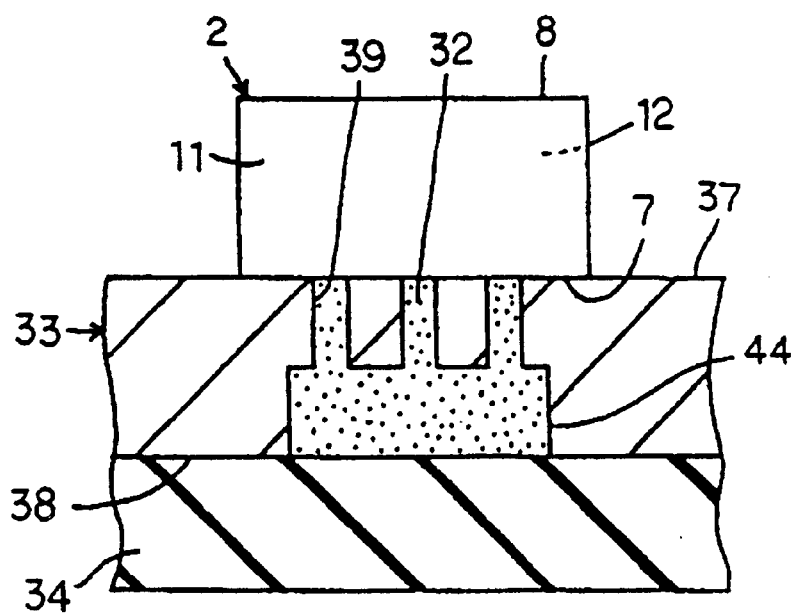
FIG. 15 is provided for illustrating the thirteenth embodiment of the present invention corresponding to FIG. 14.

FIG. 15 is provided for illustrating the thirteenth embodiment of the present invention corresponding to FIG. 14. As shown in FIG. 15, the cavity 44 is provided corresponding to one component body 2, but plural slits 39 may correspond to the component body. One cavity 44 is divided into a plurality of slits 39, and the plurality of slits are disposed to one component body 2 to provide a plurality of electrodes thereof.

The present invention is not necessarily limited to the embodiments as hitherto described with reference to the illustrations of the present invention, but various other embodiments are possible within the scope as set forth in the present invention.

For example, any shapes of the component body for forming the side face electrodes, or an area for forming the side face electrodes on the component body, may be selected. Since the number of the sites on which the side face electrodes are formed is not restricted, the number of slits to be provided on the slit plate is also not restrictive. The conductive paste may be applied on plural sites on the side faces of the component body using one slit while changing the relative position between the slit plate and the component body.

The present invention is also applicable for the electronic components in which the end face electrodes 5 and/or 6 as shown in FIG. 16 are not formed.

The conductive paste 32 has been applied from lower side to upper side while the side face 7 to be applied with the conductive paste is directed downward. However, the applying method is not limited thereto, but any directions such as vertical, lateral and or diagonal may be selected considering the properties of the conductive paste such as viscosity.

While the side face 7 of the component body 2 has been allowed to contact the first principal face 37 of the slit plate 33 in the illustrated embodiments, a slight gap may be provided between them.

While the conductive paste has been selected as a paste to be applied on the component body in the embodiments according to the present invention, the present invention can be applied for applying other pastes such as a resistive paste, an adhesive paste or an insulation paste.

According to the present invention as hitherto described, a slit plate, on which slits to be filled with a paste and having a width corresponding to the paste applying width are provided, is used in applying the paste on a part of the side face of the component body with a predetermined width. A shutter member is allowed to undergo elastic deformation by compressing the shutter member comprising an elastic material, which is disposed so as to shut an opening of the slit at the second principal face side of the slit plate, with a compression member toward the inside of the slit, thereby the paste filled in the slit is supplied so as to swell on the first principal face of the slit plate. Since the supplied paste is applied on the side face of the component body, the amount of the paste supplied onto the first principal face side of the slit plate is determined by the compressed degree of the shutter member with the compression member, or by the degree of elastic deformation of the shutter member directed toward the inside of the slit. Consequently, the degree of irregularity of the amount of the paste to be applied on the component body is reduced.

The features described above allows the applying area of the paste on the face adjoining the side faces to be readily controlled in applying the component body with the paste in the slit, when the paste is not only applied on a part of the side faces of the component body, but also extends from a part of the side face up to a part of the face adjoining the side faces.

According to the present invention, the slit may be composed of a rigid material such as a metal. Accordingly, the slit plate is never deteriorated when the slit is used for applying a conductive paste containing an organic solvent, making it possible to prolong the service life of the slit as well as maintaining the positional accuracy of the slit.

Providing a plurality of slits on the slit plate allows the paste to be simultaneously applied on plural component bodies, or the paste to be simultaneously applied on plural sites on the side faces of the component bodies, thereby improving the efficiency of the paste applying process.

The space defining the slit is provided so as not to be connected with each other among the component bodies to be applied with the paste, in other words, each slit or a set of slits corresponds to each component body, when a plurality of the slits for applying a plurality of the electronic components with the paste are provided in the apparatus for manufacturing an electronic component as described above. Therefore, the amount of the paste to be applied on each component body is not fluctuated, even when some of the component bodies accidentally happens to be absent on specified slits, thereby substantially eliminating irregularity of the amount of the applied paste.

When the component body is disposed on the first principal face side of the slit plate in the method for manufacturing an electronic component according to the present invention, the amount of applying of the paste on the component body can be controlled by forming a space between the first principal face and the component body to control the space. However, the paste can be applied with good repeatability while the applying area is favorably defined by the slit width, by allowing the component body to contact the first principal face, thereby enabling the paste to be securely applied with high quality patterns without any blurring, and with a uniform width.

Since it is not needed to make the slit width narrower than the paste applying area in order to narrow the latter, the applying width can well comply with the requirements of fining the electrodes or narrowing the pitches among the electrodes when the electrodes are formed by applying the conductive paste. Eliminating the need of further narrowing the slit width as described above allows the paste to be prevented from blocking the slit, thereby enabling the paste applying process to be stably performed with time lapsing.

When projections are provided on the compression member in the apparatus for manufacturing an electronic component according to the present invention, the shutter member comprising an elastic material can easily and securely undergo elastic deformation at the desired sites to stabilize supply of the paste.

When a cavity having a wider width than the width of the slit is provided in the apparatus for manufacturing an electronic component according to the present invention, the amount of the paste on alert for being supplied to the first principal face side through the slit can be increased, besides enabling more easily the shutter member comprising an elastic material to undergo elastic deformation, thereby stabilizing supply of the paste.

Any pastes having from relatively low to relatively high viscosities can be supplied to the first principal face side with good response when the shutter member undergoes elastic deformation by the compression member, because the capacity of the cavity is not required to be so large for attaining the effect as described above. Eliminating the need of increasing the capacity of the cavity allows excess spaces to be reduced in cleaning, thus making the cleaning work easy.

The paste charging work turns out to be efficient when the paste is supplied from the first principal face side of the slit plate into the slit for filling the slit with the paste, because disassembling of the integrated structure between the slit plate and the shutter member is not needed.

It is advantageous to previously charge the paste from the second principal face side into the cavity at the initial stage of applying the paste, particularly when the cavity is provided.

The paste can be more securely filled into the slit by the steps comprising: previously allowing the shutter member to undergo elastic deformation toward the inside of the slit by compressing the shutter member with the compression member for supplying the paste from the first principal face side as described above; applying the paste on the first principal face side so as to cover the slit; allowing the shutter member to restore elastic deformation by releasing the pressure applied from the compression member to the shutter member; and sucking the paste into the slit.

The paste can be more securely filled into the slit besides making the paste charge work more efficient by the steps comprising: applying the paste so as to be extended up to the first principal face side when the paste is applied on the first principal face so as to cover the slit; sucking the paste into the slit; allowing the squeezer to travel on the first principal face to scraped the paste off on the first principal face; and simultaneously squeezing the paste into the slit.

What is claimed is:

1. A method for manufacturing an electronic component comprising the steps of preparing a component body, and applying a paste on a part of side faces of the component body with a predetermined width, said steps comprising:

preparing a slit plate on which slits having a width corresponding to the width for applying the paste are provided, the slit plate having first and second principal faces in opposed relation with each other with a predetermined distance apart, and the first principal face side serving as a side for disposing the component body;

a shutter member comprising an elastic material disposed so as to shut the opening of the slit at the second principal face side of the slit plate; and a compression member for compressing the shutter member so as to allow the shutter member to undergo elastic deformation toward the inside of the slit;

filling the paste into the slit;

disposing the component body so that the side face thereof is directed toward the first principal face side of the slit plate; and allowing the shutter member to undergo elastic deformation toward the inside of the slit by compressing the shutter member with the compression member, thereby applying the paste in the slit on a part of the side face of the component body while supplying the paste filled in the slit so as to swell onto the first principal face side.

2. A method for manufacturing an electronic component according to claim 1, wherein the slit plate comprises a plurality of the slits.

3. A method for manufacturing an electronic component according to claim 2, wherein the step of disposing the component body on the first principal face side comprises the step of disposing each of a plurality of the component bodies so as to correspond to each of the plural slits.

4. A method for manufacturing an electronic component according to claim 2, wherein the step of disposing the component body on the first principal face side comprises the step of disposing one of the component bodies so as to be laid across the plural slits.

5. A method for manufacturing an electronic component according to any one of claims 1 to 4, wherein the step of disposing the component body on the first principal face side comprises the step of allowing a side face of the component body to contact the first principal face.

6. A method for manufacturing an electronic component according to any one of claims 1 to 4, wherein the step of applying a paste in the slit comprises the step of applying the paste in the slit so that, not only is the paste applied on a part of the side face of the component body, but also the paste extends from a part of the side face of the component body onto a part of adjoining faces.

7. A method for manufacturing an electronic component according to any one of claims 1 to 4, wherein the step of filling the paste into the slit comprises the step of supplying the paste from the first principal face side into the slit.

8. A method for manufacturing an electronic component according to claim 7, wherein the step of filling the paste into the slit comprises the steps of: previously allowing the shutter member to undergo elastic deformation toward the inside of the slit by compressing the shutter member with the compression member; restoring elastic deformation of the shutter member by releasing the pressure applied to the shutter member from the compression member after applying the paste so as to cover the slit on the first principal face side; and sucking the paste into the slit.

9. A method for manufacturing an electronic component according to claim 8, wherein the step of applying the paste so as to cover the slit on the first principal face side comprises applying the paste so as to extend onto the first principal face, further comprising the step of raking the excess paste on the first principal face followed by squeezing the paste into the slit by allowing a squeezer to operate on the first principal face after the step of sucking the paste into the slit.

10. A method for manufacturing an electronic component according to any one of claim 1 to 4, wherein the paste is a conductive paste for forming electrodes on a part of the side faces of the component body.

11. A method for manufacturing an electronic component according to claim 5, wherein the step of applying a paste in the slit comprises the step of applying the paste in the slit so that, not only is the paste applied on a part of the side face of the component body, but also the paste extends from a part of the side face of the component body onto a part of adjoining faces.

12. A method for manufacturing an electronic component according to claim 11, wherein the step of filling the paste into the slit comprises the step of supplying the paste from the first principal face side into the slit.

13. A method for manufacturing an electronic component according to claim 5, wherein the step of filling the paste into the slit comprises the step of supplying the paste from the first principal face side into the slit.

14. A method for manufacturing an electronic component according to claim 6, wherein the step of filling the paste into the slit comprises the step of supplying the paste from the first principal face side into the slit.

* * * * *